United States Patent [19]

Schlereth et al.

[11] Patent Number: 5,233,190
[45] Date of Patent: * Aug. 3, 1993

[54] FOURIER TRANSFORM MOLECULAR SPECTROMETER

[75] Inventors: Fritz H. Schlereth, Syracuse; Duane P. Littlejohn, Manlius, both of N.Y.; James E. Phillips, Brookline, Mass.

[73] Assignee: Leybold Inficon Inc., East Syracuse, N.Y.

[*] Notice: The portion of the term of this patent subsequent to Oct. 1, 2008 has been disclaimed.

[21] Appl. No.: 797,462

[22] Filed: Nov. 22, 1991

Related U.S. Application Data

[63] Continuation-in-part of Ser. No. 494,580, Mar. 16, 1990, abandoned.

[51] Int. Cl.[5] .................. B01D 59/44; H01J 49/00
[52] U.S. Cl. .................................. 250/291; 250/283; 250/282
[58] Field of Search .................. 250/282, 283, 291

[56] References Cited

U.S. PATENT DOCUMENTS

| | | |
|---|---|---|
| 3,937,955 | 2/1976 | Comisarow et al. ............ 250/283 |
| 4,755,670 | 7/1988 | Syka et al. ...................... 250/282 |
| 4,956,788 | 9/1990 | Guan et al. ...................... 364/498 |
| 4,996,423 | 2/1991 | Hanna .............................. 250/281 |
| 5,013,912 | 5/1991 | Guan et al. ...................... 250/291 |
| 5,063,710 | 10/1991 | Schlereth ........................ 324/312 |

Primary Examiner—Bruce C. Anderson
Attorney, Agent, or Firm—Wall and Roehrig

[57] ABSTRACT

A molecular spectrometer is provided that performs Fourier analysis utilizing the discrete Fourier Transform on a digitized time domain waveform that relates to the composition of a sample. Digitized reference waveforms are employed to permit the instrument to limit its analysis to frequencies of interest and thereby increase the rapidity of the analysis. Data at differing frequencies can be resolved at independent resolutions, and the instrument can analyze spectroscopic data in real time.

14 Claims, 2 Drawing Sheets

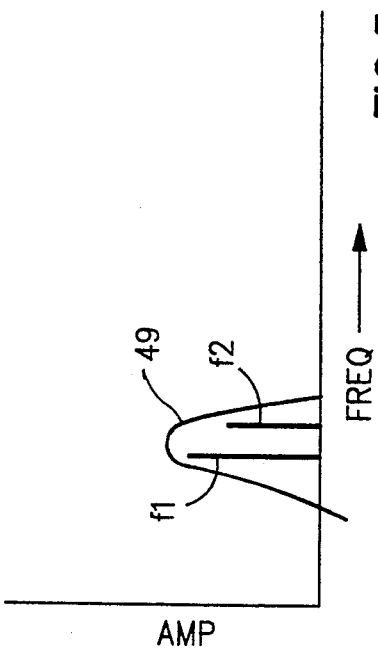
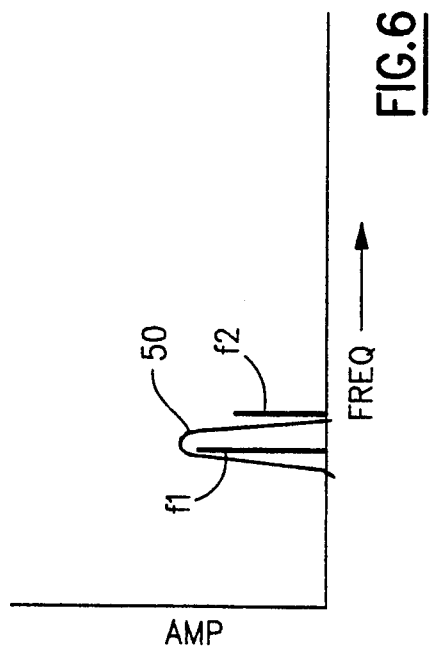
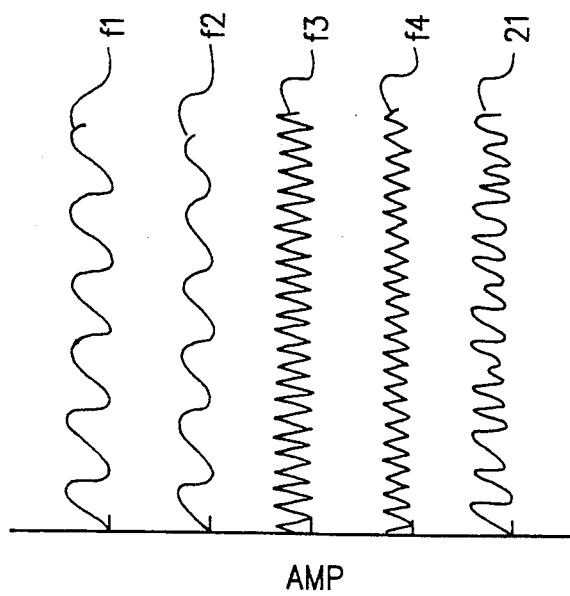
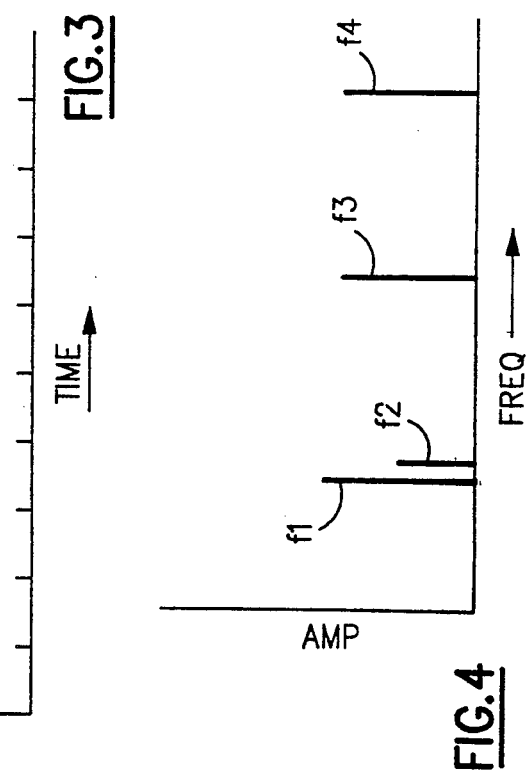

FOURIER TRANSFORM MOLECULAR SPECTROMETER

This application is a continuation-in-part of application No. 07/494,580 for FOURIER TRANSFORM MOLECULAR SPECTROMETER filed Mar. 16, 1990, now abandoned.

BACKGROUND OF THE INVENTION

This invention relates to spectroscopy wherein specific frequency signals related to physical events of interest occur simultaneously with other frequency signals and, in particular, to the use of a Discrete Fourier Transform in spectroscopy or other similar analyzing techniques wherein a plurality of simultaneously occurring physical events manifest themselves in the form of periodic oscillations.

As one example of the spectroscopies exhibiting these features, there is disclosed in U.S. Pat. No. 3,937,955 to Comisarow et al, a multi-channel ion cyclotron resonance (ICR) mass spectrometer that utilizes Fast Fourier Transform (FFT) to analyze an entire range of frequencies. A gas sample is introduced into the ICR cell where molecular species contained in a sample are ionized and then excited whereby the ions orbit at different frequencies determined by their mass. The image current produced by the orbiting ions is sensed and a waveform generated that contains information relating to the species present in the sample. The waveform data is digitized and the digitized information transformed using a Fast Fourier Transform (FFT) operation.

The use of FFT in an ICR instrument offers rapid means for analyzing various types of samples and is an effective method by which the entire spectrum within the range of the instrument can be examined. The characteristics of FFT are, however, not truly compatible with the ICR sensor because the sensor frequencies are inversely related to the mass of ions present in a sample, while the FFT analysis occurs at fixed frequency intervals and requires that all frequencies within the spectrum be analyzed. As a practical result, much of the available instrument computer power is expended on analyzing segments of the spectrum that contains either no information at all or information that is of no analytical interest to the user because the frequency or frequencies of interest occur only in a small segment of the overall spectrum.

It should be further noted that the resolution of a FFT instrument is also limited by the amount of time and computer power available to resolve all frequencies within the instrument's spectral range without regard to what the spectrum contains or, more importantly, does not contain. This again places a heavy demand on the instrument in terms of time and power and, as a consequence, the cost of building and operating a high resolution instrument is typically high.

SUMMARY OF THE INVENTION

It is therefore an object of the present invention to rapidly and efficiently detect specific physical events relating to chemical spectroscopy that manifest themselves in the form of periodic oscillations in the presence of other similar events.

It is a further object of the present invention to utilize a Discrete Fourier Transform in chemical spectroscopy for analyzing discrete frequency signals contained within a broad frequency range, containing other signals.

Another object of the present invention is to improve spectrometry by high resolution analysis of discrete frequency signals of specific interest.

Yet another object of the present invention is to provide a spectrometer that utilizes Discrete Fourier Transform to detect discrete frequencies to the exclusion of other frequencies to more effectively employ available computer power.

A still further object is to combine the advantages of Fast Fourier Transform with those of Discrete Fourier Transfer when analyzing spectrometry data.

These and other objects of the present invention are attained by means of an instrument for generating a time domain waveform containing a mixture of periodic oscillations, each of which relates to the frequency of a physical event. A Discrete Fourier Transform of the time domain waveform is achieved by multiplying the waveform with at least one digitized reference waveform point by point and summing the resultant products. The magnitude of the resultant sum indicates the presence of the physical event occurring at the same characteristic frequency as the digitized reference frequency. In one embodiment of the invention a low resolution Fast Fourier Transform operation is performed on the digital output signal to identify spectral regions of specific interest on which to perform a subsequent Discrete Fourier Transform.

BRIEF DESCRIPTION OF THE DRAWINGS

For a better understanding of these and other objects of the present invention, reference shall be made to the following detailed description of the invention which is to be read in association with the accompanying drawings, wherein:

FIG. 3 is a diagrammatic view showing a plurality of time domain signals sensed by the instrument shown in FIG. 1, along with a composite waveform generated by the instrument sensor which is a summation of the sensed signals;

FIG. 4 is a diagrammatic view showing a Fast Fourier Transform of the composite waveform shown in FIG. 3 wherein signal amplitude is plotted against frequency;

FIG. 5 is an enlarged diagrammatic view similar to that shown in FIG. 4 illustrating a Discrete Fourier Transformation at a first resolution; and FIG. 6 is an enlarged diagrammatic view similar to that shown in FIG. 4 further illustrating a Discrete Fourier Transformation at a second higher resolution.

DETAILED DESCRIPTION OF THE INVENTION

Although the present invention has broader application, it will be herein explained with reference to an ion cyclotron resonance (ICR) mass spectrometer. As will become apparent from the disclosure below, however, the invention is ideally suited for use in any type of instrument used to detect or analyze data relating to simultaneously occurring physical events that manifest themselves as periodic oscillations. As disclosed by Comisarow et al. in the above noted U.S. patent, ICR mass spectrometers have been greatly improved through the use of Fast Fourier Transform techniques. These instruments, nevertheless, have practical limitations based on the cost of equipment, the amount of computer power consumed, and the processing time required to analyze the acquired data.

Figure 1:
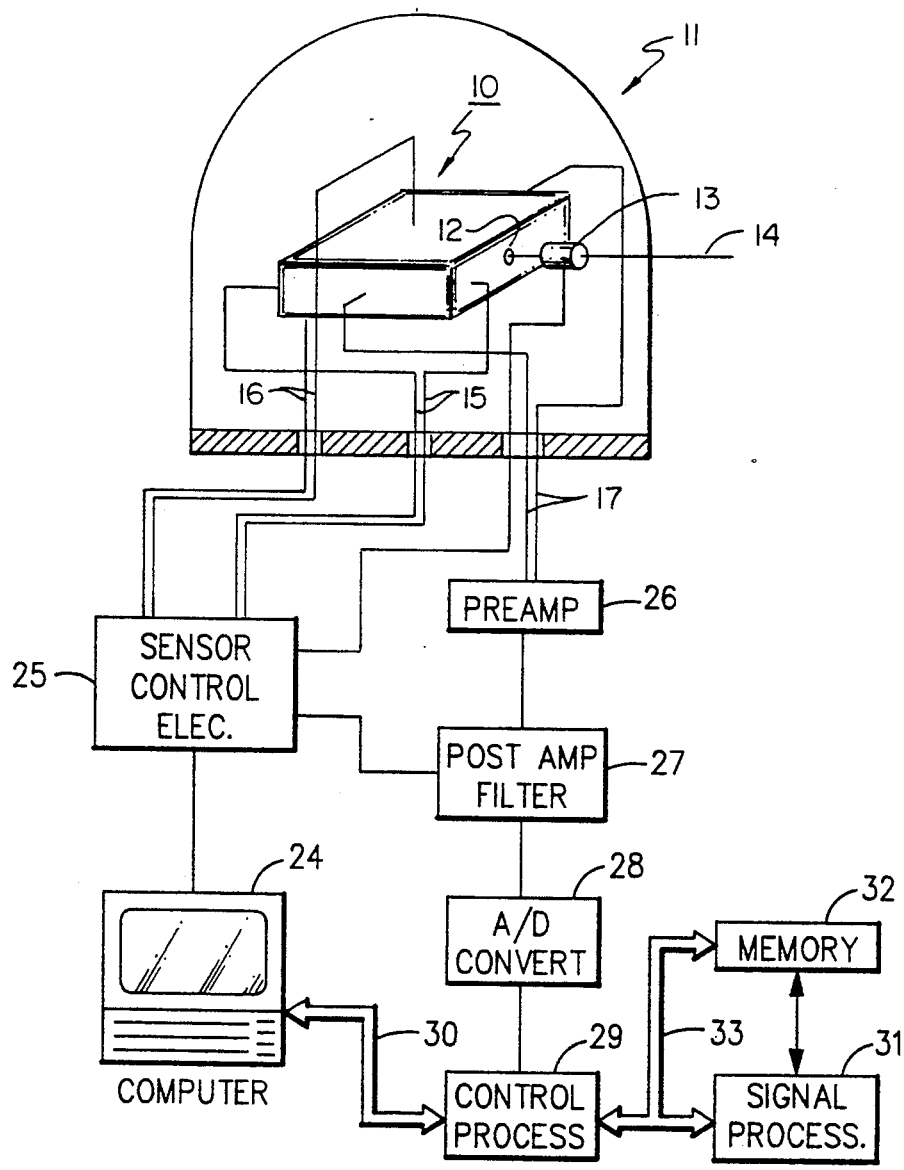
FIG. 1 is a schematic block diagram showing an instrument embodying the teachings of the present invention.

With reference to the drawings, and initially to FIG. 1, there is shown an ICR ionization cell generally referenced 10, which is in the form of a "pillbox" having opposed rectangular walls made of an electrically conductive material. The cyclotron cell is shown mounted in a vacuum chamber that is designated 11. The cell has opposed top and bottom plates, a pair of opposed side plates and a pair of opposed end plates. Small apertures, such as aperture 12, are provided in axial alignment in the two end plates to allow an electron beam emanating from electron gun 13 to pass through the cell along axis 14 to ionize molecules of a sample contained within the cell.

A trapping potential is carried by leads 15—15 to the end plates of the cell while an excitation potential is applied by leads 16—16 to the top and bottom plates thereof. The two side plates are used to sense or detect image current data and send this information to a preamplifier unit 26 via leads 17—17. A strong magnetic field is placed uniformly over the cell with the lines of flux extending parallel with the axis 14 of the ionizing beam. The chamber 11, during operation, is evacuated and a sample to be analyzed is admitted into the chamber through pressure reducing inlet (not shown). The sample typically contains one or more molecular species of interest which, at low pressures, become randomly distributed throughout the chamber and the cyclotron cell 10.

The operation of the cyclotron cell is well known and is discussed in detail in the previously noted Comisarow et al. patent. The disclosure contained in the Comisarow et al. patent is herein incorporated by reference to the extent needed for a more thorough understanding of the present invention. The sample within the cell is subjected to an ionizing process. This can be done by momentary exposure to an electron beam causing some of the sample molecules to become ionized. Other suitable methods of ionizing a sample may be used as required by a given application, such as chemical or photo-ionization, or collisional dissociation. The ionizing step can be omitted if the sample to be analyzed is already in ionic form. The ionized molecules orbit within the magnetic field about the axis 14. The size of each individual orbit is determined by the thermal energy of the ion and the mass of the molecule contained in the orbit. The trapping potential on the end plates is raised to a level so as to contain the ions within the cell for a finite period of time. The ions thus experience a simple harmonic motion along the axis of the cell, while maintaining their particular orbital motion around the axis, with each molecular species orbiting at its own cyclotron frequency. The ions are then excited into higher orbital state by momentarily applying a sinusoidal signal of the same frequency as its cyclotron frequency to the top and bottom excitation plates. The electrical charges produced by the rotating ions are detected by the two opposed side plates and the output is applied to leads 17—17 to provide a time domain waveform that is a summation of the sinusoidal image currents generated by the orbiting ionized molecules contained within the magnetic field established inside the cell.

Turning now to FIGS. 3-6, it will be assumed for purpose of explanation that four discrete molecular species are present in a gas sample introduced in the ICR cell 10 shown in FIG. 1 Accordingly, four frequency signals are detected by the sensing plates of the cell which are illustrated as the sinusoidal frequency signals f1-f4 in FIG. 3. These four frequency signals are contained in the output waveform generated by the sensing plates of the cell. The waveform is illustrated by the representative curve 21 in FIG. 3.

As illustrated in FIG. 1, the present system utilizes a computer 24 located at a user work station to interface with various system components. The computer issues high level commands as well as providing a visual display of the resulting analysis. The computer is connected by appropriate leads to a sensor control electronic module 25 which generates necessary control signals and excitation voltages that are applied to the plates of ionization cell 10.

The composite output waveform 21 (FIG. 3) produced by the cell is a time domain signal which is initially sent through a preamplifier 26 to a post amplifier anti-aliasing filter 27 where unwanted background and noise are removed from the amplified waveform. The filter is controlled by a signal from the sensor control module 25. The filtered time domain waveform is then applied to an analog to digital converter 28 where waveform data is digitized. A digital output waveform, comprising a stream of digital bytes, each having a sample width containing a predetermined number of bits, is fed to a control processor 29. The control processor is coupled to the computer by bus 30 and to a signal processor 31 and a memory unit 32 by a bifurcated bus 33.

Figure 2:
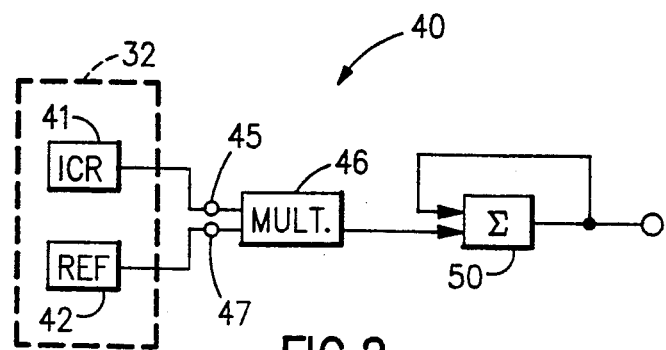
FIG. 2 is a block diagram showing a portion of the signal processing circuitry employed in the instrument of FIG. 1.

The signal processor of the present instrument contains circuitry that is able to perform both a low resolution (or even high resolution) FFT and a high resolution DFT computations on the digitized waveform data stored in the waveform section 41 of the memory (FIG. 2). The low resolution FFT computation is used to provide an initial presentation on the computer screen of the entire frequency spectrum present in the output waveform as illustrated in FIG. 4. This, in turn, allows for rapid identification of those frequencies that are present relating to specific molecular species of interest without expending a great deal of computer power. With this information, the instrument can be programmed to perform DFT computations on preselected spectral segments or heuristically determined segments based on preprogrammed selection criteria. This is accomplished by first loading data relating to one or more reference signals relating to the frequencies of interest into the memory. The control processor includes a tunable reference signal generator which, upon command from the computer, places the desired reference signal of a selected frequency into the reference signal section 42 of the memory. The sinusoidal reference wave or waves are selected to match the cyclotron frequency or frequencies of ionic species of specific interest.

As illustrated in FIG. 2, the waveform section 41 of the memory is connected to a first input 45 of a multiplier circuit 46 while the reference signal section 42 of the memory is connected to the second input 47 of the multiplier circuit. The output of the multiplier circuit is coupled to adder circuit 50 that is wired in and includes an accumulator. In practice, the reference signals can be either stored in memory as shown, or fed directly to the multiplier from the computer through the control processor 29. Although a multiplier is utilized in the preferred embodiment of the present invention, other circuits suitable for combining and/or comparing the output waveform with a reference signal of a predetermined frequency to determine if there are components in the waveform that are at the reference signal frequency can be used without departing from the teachings of the invention.

The stored bytes relating to the digital waveform data and corresponding digital reference frequency signal data are fed to the multiplier circuits where they are multiplied point by point and the resultant products summed by the adder and accumulated to provide a data point signal. As long as the reference signal is coherent with some component of the output waveform, the adder will continue to sum the resultant products and provide a data point signal. If the reference signal frequency is not present in the digitized waveform, the resultant product values will cancel each other and the output of the adder circuit will be near zero. The output resolution of the adder circuit can be enhanced by either increasing the data sampling times or by increasing the number of bits in each byte used to represent a data sample.

The signal envelope of the adder circuit is illustrated by curve 49 shown in FIG. 5. In this particular case, the frequency of the reference signal is centered at about frequency f1 and the resolution of transform is low. As a result, ionic species represented by frequencies f1 and f2 are included beneath the signal envelope. To more clearly resolve the data point at frequency f1, the summing time of the adder circuit can be increased and/or the number of bytes relating to the digital waveform can be increased. This produces a sharper resolution envelope as shown at 50 in FIG. 6. In this case the resolution is high enough to exclude the data point signal relating to frequency f2. Data relating to frequency f1 is clearly discernable and thus can be accurately analyzed.

The DFT processor 40, as shown in FIG. 2 can be realized using a digital processing circuit such as that shown in model AD 2100 from Analog Devices Corporation. A single circuit as this can be operated in a time division multiplex mode to analyze several frequencies simultaneously. Under normal operating conditions, a device having the clock rate of the AD 2100 can be used to construct 50 DFT filters when operated in a time multiplexed mode which, in turn, can be used to analyze a like number of discrete frequencies at the same time.

The advantages of the invention as presented above can be further appreciated by a discussion of certain attributes of Fourier Processing and an example: As is well known, the FFT represents a fast algorithm for the computation of the discrete Fourier Transform (DFT). However in order to take advantage of the FFT it is necessary to operate on a batch of data. When variable frequency resolution is required, this is a serious drawback, because each batch must be processed at a fixed resolution. And, as previously mentioned, the necessary processing of frequencies of no interest by the FFT is wasteful in computation time, especially in those instances where it is known in advance that there are only a few frequencies of interest in the spectrum.

Typical FFT analysis of mass spectrometer data proceeds in accordance with the following procedure:

1. Collect and store a time data set, say 1024 points. It is not necessary, but is often convenient to use a number of points that is a power of 2.
2. Perform the FFT on this data set. Resolution is then determined by the time the spectrometer is sensing a sample containing charged particles, or the measurement time $T_w$. The resolution is approximately proportional to $1/T_w$. It will be apparent that a higher resolution requires a longer measurement time. To accomplish the FFT it is necessary to compute the energy at all frequencies, regardless of whether it is needed.

The use of the DFT, while requiring more computations, has the advantages that it can single out particular frequencies for analysis and each of the frequencies can be analyzed at an independent resolution. It is not necessary to store the data set prior to the analysis, although it may be convenient to do so. It is certainly unnecessary to store the value of the energy at unwanted frequencies.

EXAMPLE

A data set contains energy at frequencies g1, g2 and g3. g1 and g2 are separated by 0.01 Hz. g3 is separated from g1 and g2 by 10 Hz. Assume that it requires a data sample of at least 100 seconds to resolve g1 and g2, and that g3 can be adequately analyzed by a sample of 0.1 sec. Assume further that the sample rate, which should be at least twice the highest frequency of interest, is 100 KHz, and that a single sample is represented by 8 bits (1 byte). The data storage required to store the data samples would be 10 Mbytes if the FFT were to be performed. In the case of the DFT, no storage of the data is needed, because the Fourier analyses can be performed in real time as the data is being collected in the mass spectrometer. Such real time analysis is not possible with he FFT, because analysis cannot proceed until the all of the data set is available.

Using the DFT g1, g2 and g3 can be analyzed with different resolutions. The data obtained from the spectrometer is simply a string of data appended during multiple sampling intervals that are established by the 100 kHz sampling rate. A data reading is obtained that is long enough to secure the highest resolution desired among the frequencies of interest. For frequencies at which a lower resolution will suffice it is only necessary to utilize a portion of sampling intervals in the DFT computation that comprise the data. In performing the DFT a portion of the digitized output waveform in the instrument is associated with a digitized reference waveform for each frequency to be analyzed. Further savings of computational resources can be thus be achieved.

As should be evident from the disclosure above, the apparatus of the present invention can be programmed to analyze only those frequencies of interest to the exclusion of all other frequencies within the range of the instrument. Known background gases, such as nitrogen and argon can be used to simply and accurately calibrate the instrument. From this information exact frequencies relating to specific events can be digitally established. Entire segments of the frequency or spectral range of the instrument can be excluded from the analysis because of prior knowledge developed by user or simply because this data lies in a domain in which there is no specific interest. The amount of computer power and time devoted to resolving signal can thus be concentrated on those discrete frequencies of interest which typically lie in a limited number of bands within the spectral range of the instrument. Accordingly, economy of both time and money is realized while increasing data resolution.

The present system is capable of operating with low resolution A/D converters while still providing high resolution processing of the frequencies of interest. Furthermore, the system can be programmed to analyze only specific frequencies of interest as well as the bandwidth resolution required to properly analyze these signals. Additionally, the control program for operating the systems and to interface the various circuits involves a straightforward application of conventional programming procedures which can be accomplished by an experienced programmer.

While this invention has been explained with reference to the structure disclosed herein, it is not confined to the details as set forth and this application is intended to cover any modifications and changes as may come within the scope of the following claims.

What is claimed is:

1. A method of mass spectroscopy, comprising the steps of:
    placing a sample to be tested into a cyclotron cell;
    reducing atmospheric pressure within said cyclotron cell;
    establishing a magnetic field within said cyclotron cell;
    exciting coherent motion of charged particles in said sample so that said charged particles orbit within said cyclotron cell at frequencies that are characteristic of said particles;
    converting orbital motion of said excited particles into a time domain analog waveform that is a summation of signals that are generated by said excited particles;
    digitizing said analog waveform to provide a digital output waveform;
    generating at least one digitized reference waveform having a frequency of interest that is characteristic of orbital motion of a given charged particle;
    multiplying point by point the digital output waveform and said digitized reference waveform to obtain resultant products, and
    summing the resultant products to provide a data point signal having information contained therein that is determinative of said given charged particle, whereby following said steps of generating, multiplying and summing a Discrete Fourier Transform (DFT) that is limited to said frequencies of interest is accomplished on said digital output waveform.

2. The method of claim 1, wherein said steps of converting, digitizing, generating, multiplying and summing are performed simultaneously, so that a DFT is performed in real time during spectroscopy.

3. The method of claim 1, further including the step of associating a portion of said digital output waveform with a digitized reference waveform prior to said step of multiplying, and said step of multiplying is performed with a plurality of digitized reference waveforms, so that a DFT is performed at an independent resolution on said digital output waveform with each of said digitized reference waveforms.

4. The method of claim 1, further comprising the step of ionizing particles that are contained within said sample.

5. The method of claim 1 further including the steps of:
    storing data relating to the digital output waveform in a memory;
    performing a Fast Fourier Transform on the digitized waveform data that is stored in said memory; and
    identifying said frequency of interest from said Fast Fourier Transform.

6. The method of claim 1 that includes the further step of storing data relating to said digital output waveform in a memory along with a plurality of preselected digital reference waveforms and performing a Discrete Fourier Transform on said digital output waveform that is limited to each of said stored reference waveforms.

7. The method of claim 1 that includes the further step of filtering said analog waveform prior to digitizing said analog waveform to remove unwanted noise therefrom.

8. The method of claim 1 that includes the further step of processing a plurality of different digitized reference waveforms through a single multiplier on a time shared basis.

9. The method of claim 1 that further includes the step of applying the data point signal to a visual readout means for immediate evaluation.

10. The method of claim 1 wherein said step of digitizing includes the further step of selecting a number of bits to represent a data sample at a desired resolution.

11. A mass spectrometer having a cyclotron cell that includes
    evacuation means connected to said cell for reducing atmospheric pressure in said cell to a predetermined level;
    sample introduction means for placing a sample to be analyzed into said cell;
    means for establishing a magnetic field in said cell;
    sensor means for detecting orbiting charged particles that are subjected to electromagnetic fields within said cyclotron cell and for converting orbital motions of said charged particles into a time domain analog waveform that is a summation of signals generated by said orbiting charged particles;
    digitizing means, coupled to said sensor means, for converting said analog waveform to a digital output waveform;
    means for generating a digitized reference waveform having a preselected frequency of interest that is characteristic of orbital motion of a given charged particle;
    multiplying means, coupled to said digitizing means, for multiplying said digital output waveform point by point with said digitized reference waveform to obtain resultant products; and
    adder means, coupled to said multiplying means for summing the products to provide a data point signal,
    whereby said means for generating, said multiplying means and said adder means cooperate to accomplish a Discrete Fourier Transform that is limited to frequencies of interest on said digital output waveform, and said data point signal has information contained therein that is determinative of said given species of charged particles.

12. The apparatus of claim 11, further comprising means for ionizing particles in said sample.

13. The apparatus of claim 11, wherein said sensor means, said digitizing means, said means for generating a digitized reference waveform, said multiplying means, and adder means operate simultaneously, so that a discrete Fourier transform is performed in real time.

14. The apparatus of claim 11, further including means, coupled with said means for generating a digitized reference waveform and said multiplying means, for associating a portion of said digital output waveform with a digitized reference waveform, so that a given resolution at a frequency of interest can be achieved.

* * * * *